United States Patent [19]

Hagihara

[11] Patent Number: 5,430,668
[45] Date of Patent: Jul. 4, 1995

[54] FLOATING POINT MULTIPLIER CAPABLE OF EASILY PERFORMING A FAILURE DETECTION TEST

[75] Inventor: Yasuhiko Hagihara, Tokyo, Japan

[73] Assignee: NEC Corporation, Tokyo, Japan

[21] Appl. No.: 206,834

[22] Filed: Mar. 7, 1994

[51] Int. Cl.$^6$ .............................................. G06F 7/38
[52] U.S. Cl. ................................................... 364/748
[58] Field of Search ................................. 364/748, 745

[56] References Cited

U.S. PATENT DOCUMENTS

| | | | |
|---|---|---|---|
| 5,150,319 | 9/1992 | Zyner | 364/748 |
| 5,150,320 | 9/1992 | Nakayama | 364/748 |
| 5,197,023 | 3/1993 | Nakayama | 364/748 |
| 5,268,854 | 12/1993 | Ikumi | 364/748 |
| 5,303,175 | 4/1994 | Suzuki | 364/748 |

OTHER PUBLICATIONS

"IEEE Standard for Binary Floating-Point Arithmetic", *American National Standard*, pp. 1–18, (1985).

*Primary Examiner*—Tan V. Mai
*Attorney, Agent, or Firm*—Foley & Lardner

[57] ABSTRACT

A floating point multiplier includes an exponential part adder for receiving and adding exponential parts of a multiplied value and a multiplying value and outputting an exponential addition result, a binary multiplier for receiving and multiplying mantissa of the multiplied value and the multiplying value and for outputting the multiplication result, an OR gate inputting for receiving a predetermined number of lower order bits of the multiplication result and outputting a logical sum of the lower order bits as a sticky bit, rounding process and normalization process circuit for receiving a predetermined number of higher order bits of the multiplication result and the sticky signal, performing a rounding process and a normalizing process for the higher order bits of the multiplication result on the basis of the sticky bit, coupling a result of normalization with the addition result of the exponential parts and outputting a final multiplication result, and a selection circuit for receiving the final multiplication result and the lower order bits of the multiplication result of the binary multiplier and selectively outputting.

8 Claims, 2 Drawing Sheets

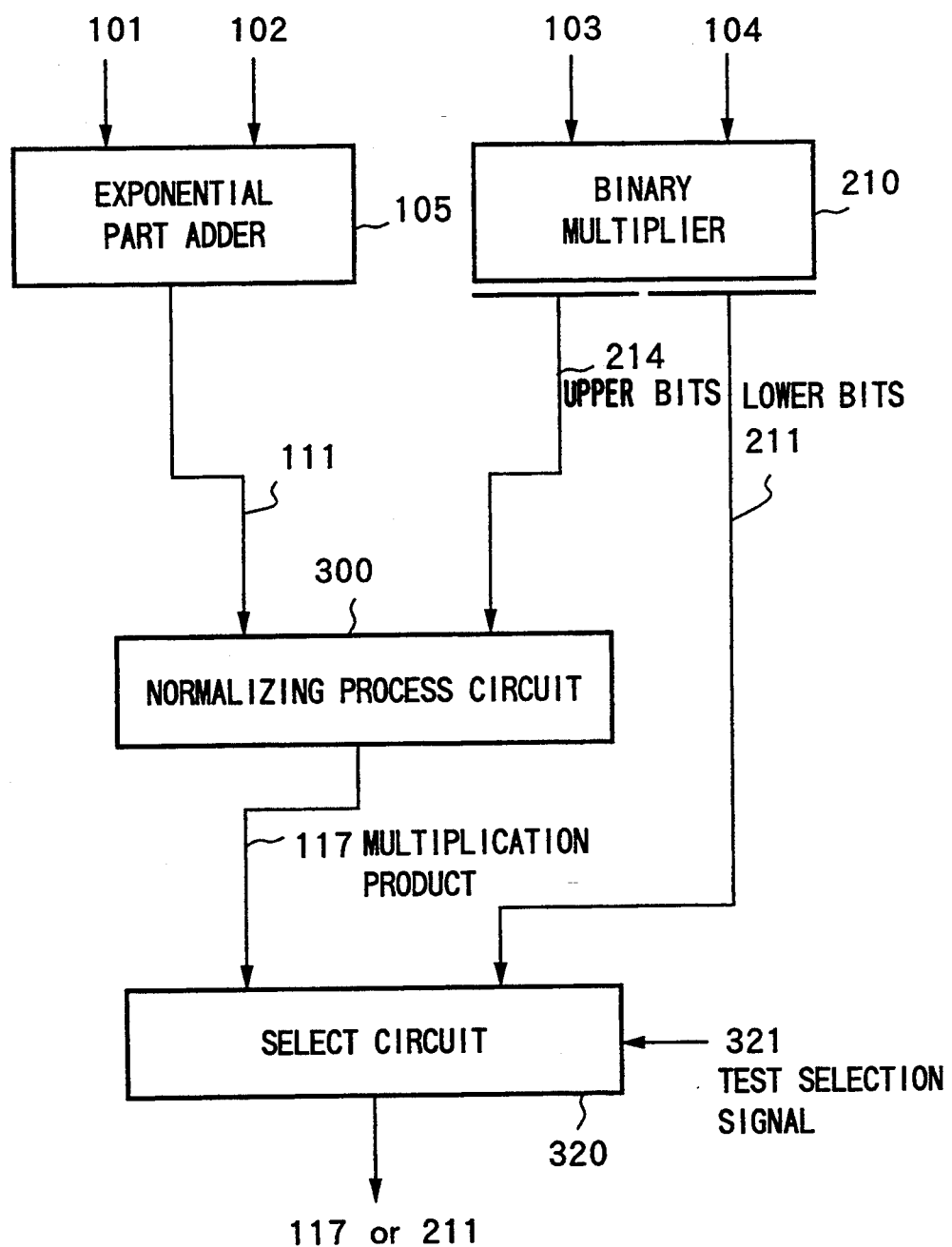

FLOATING POINT MULTIPLIER CAPABLE OF EASILY PERFORMING A FAILURE DETECTION TEST

BACKGROUND OF THE INVENTION

1. Field of the Invention

The present invention relates to a floating point multiplier composed of integrated circuits. More specifically, the invention relates to a floating point multiplier which can be easily tested after production.

2. Description of the Related Art

When performing a floating point multiplication, an adding process for exponential parts of a multiplied value and a multiplying value, a multiplying process for a mantissa, a rounding process for the product of multiplication of the mantissa, and a normalizing process are performed to finally obtain the result of the multiplication. In the floating point multiplication, the mantissa of the result is obtained from upper half bits of the product of multiplication of the mantissa of the two inputs and a total sum of truncated lower bits. Concerning such floating point multiplication method have been described in IEEE 754, "IEEE Standard for Binary Floating-Point Arithmetic".

In the conventional floating point multiplier, exponential parts of the floating point multiplied value and multiplying value separated through the preceding process step are added by an exponential part adder. On the other hand, the mantissa of the floating point multiplied value and the multiplying values are multiplied by a binary multiplier. When the mantissa is n bits, multiplication is performed by inputting p bits ($p \geq n$) of the mantissa to the binary multiplier. From the binary multiplier, $2p-1$ bits of a product of the multiplication are output. From the product of multiplication of the mantissa in the binary multiplier, a sticky bit of the lower m bits is derived.

On the other hand, on the basis of the sticky bit, a rounding process and a normalizing process for the upper q bits ($q > n$) are performed so that a final product of multiplication can be output by combining the results of the rounding process and the normalizing process with the mantissa processed through the adding process.

The binary multiplier receives two binary values of bit length p ($p \geq n$) assuming the length of the mantissa of floating point is n bits, and then outputs two binary values of bit length ($2p-1$). The output to be input to the rounding process and the normalizing process are the upper q bits and a sticky bit of the truncated lower ($2p-1-q=m$) bits.

As set forth above, in the conventional floating point multiplier, the lower m bits of the mantissa of the product of the binary multiplication are aggregated as a sticky bit. Therefore, even when there is a faulty gate in the binary multiplier, it is difficult to detect failure of the gate on the basis of the output. Concerning the gate corresponding to the upper bits of the binary multiplier, a test can be performed by monitoring the external output since the upper bits are externally output as the final result of multiplication. Therefore, there should not have been raised the problems as those raised in testing the lower bits.

In order to detect the failure of 1 bit in the lower output in question, it becomes necessary apply a test pattern with such multiplied values and multiplying values to set all other lower output bits to "0" other than the bit in question, and vary the bit in question between "0" and "1". Accordingly, for testing failure of all bits of the lower output, a large number of test patterns set forth above are to be prepared for each digit of the lower bits for performing testing by inputting each test pattern, one by one, thereby making testing very cumbersome. Also, since the sticky bit of an OR gate is an internal signal instead of an externally output signal, testing becomes even more cumbersome.

The following is an example of the test pattern:

Assuming that the lower m bits of the output of the binary multiplier is 5 bits, in order to detect failure of the gate for the second least significant bit, for example, "10101" and "11010" are input as the multiplied value and the multiplying value. When these two values are multiplied, if failure is not caused in the gate of the binary multiplier, the following calculation will be performed:

$$\begin{array}{r} 10101 \\ \times\ 11010 \\ \hline 1000100010 \end{array}$$

From this, "1000100010", in which among the lower 5 bits, the second least significant bit in question is "1" and all other bits are "0" is output. If the gate corresponding to the second least significant bit is in failure, the second bit becomes "0" so that the sticky bit of the lower 5 bits becomes "0". Thus, failure of the gate can be detected.

Assuming that the lower m bits of the output of the binary multiplier is 5 bits, in order to detect failure of the gate for the fourth lower bit, for example, "10111" and "11000" are input as the multiplied value and the multiplying value. When these two values are multiplied, if failure is not caused in the gate of the binary multiplier, the following calculation will be performed:

$$\begin{array}{r} 10111 \\ \times\ 11000 \\ \hline 1000101000 \end{array}$$

From this, "1000101000", in which among the lower 5 bits, the fourth lower bit in question is "1" and all other bits are "0" is output. If the gate corresponding to the second least significant bit is in failure, the fourth lower bit becomes "0" so that the sticky bit of the lower 5 bits becomes "0". Thus, failure of the gate can be detected.

As set forth above, since failure of the gate is detected from the result of the multiplication of a large number of test patterns which are preliminarily prepared, the testing is very labor and time intensive work.

SUMMARY OF THE INVENTION

Therefore, it is an object of the present invention to provide a floating point multiplier which can easily perform a failure detection test for gates of a binary multiplier on the basis of lower bits of a result of multiplication performed by a binary multiplier which performs multiplication of the mantissa.

In order to accomplish the above-mentioned and other objects, a floating point multiplier, according to one aspect of the invention, comprises:

exponential part adder means for receiving exponential parts of a multiplied value and a multiplying value and effecting the process of addition to output an addition result of the exponential parts;

binary multiplier means for receiving mantissa of the multiplied value and the multiplying and effecting the process of multiplication to output a multiplication result of the mantissa;

an OR gate for receiving predetermined digits of the multiplication result of lower bits to output as a sticky bit;

rounding process and normalization process means for receiving predetermined digit of upper bits of the multiplication result and the sticky bit, performing rounding process and the normalizing process for the upper bits of the multiplication result on the basis of the sticky bit, and coupling the result of normalization with the addition result of the exponential parts to output a final multiplication result; and selection means for receiving the final multiplication result and the lower bits of the multiplication result of the binary multiplier for selectively outputting.

According to another aspect of the invention, a floating point multiplier comprises:

exponential part adder means for receiving exponential parts of a multiplied value and a multiplying value and effecting the process of addition to output an addition result of the exponential parts;

binary multiplier means for receiving mantissa of the multiplied value and the multiplying value and effecting the process of multiplication to output a multiplication result of the mantissa;

normalization process means for receiving predetermined digits of upper bits of the multiplication result and the addition result of the exponential parts, performing the normalizing process for the upper bits of the multiplication result, and coupling the result of normalization with the addition result of the exponential parts to output a final multiplication result; and selection means for receiving the final multiplication result and a predetermined digits of lower bits of the multiplication result for selectively outputting.

In the preferred construction, the selection means receives an externally provided selection signal for outputting the final multiplication result when the selection signal is absent and for outputting the lower bits of the multiplication result only when the selection signal is received. Preferably, the selection means comprises a multiplexer.

The binary multiplier may receive mantissa of a bits as p (p≧n) and may output the multiplication result of (2p−1) bits; and the selection means may receive the final multiplication result and the lower (2p−1−q) bits of the multiplication result of the binary multiplier.

Also, the OR gate may receive the lower (2p−1−q) bits (q>n) for deriving an output as one sticky bit, and the rounding process and normalizing process means may receive the upper q bits of the multiplication result of the binary multiplier, the addition result and the sticky bit.

Other objects, feature and advantages of the present invention will become apparent from the detailed description given herebelow.

BRIEF DESCRIPTION OF THE DRAWINGS

The present invention will be understood more fully from the detailed description of the invention and the accompanying drawings of the preferred embodiment, which, however, should not be taken to be limitations of the invention, but are for explanation and understanding only.

In the drawings:

FIG. 2 is a block diagram showing a construction of the second embodiment of a floating point multiplier according to the present invention.

DESCRIPTION OF THE PREFERRED EMBODIMENT

Figure 1:
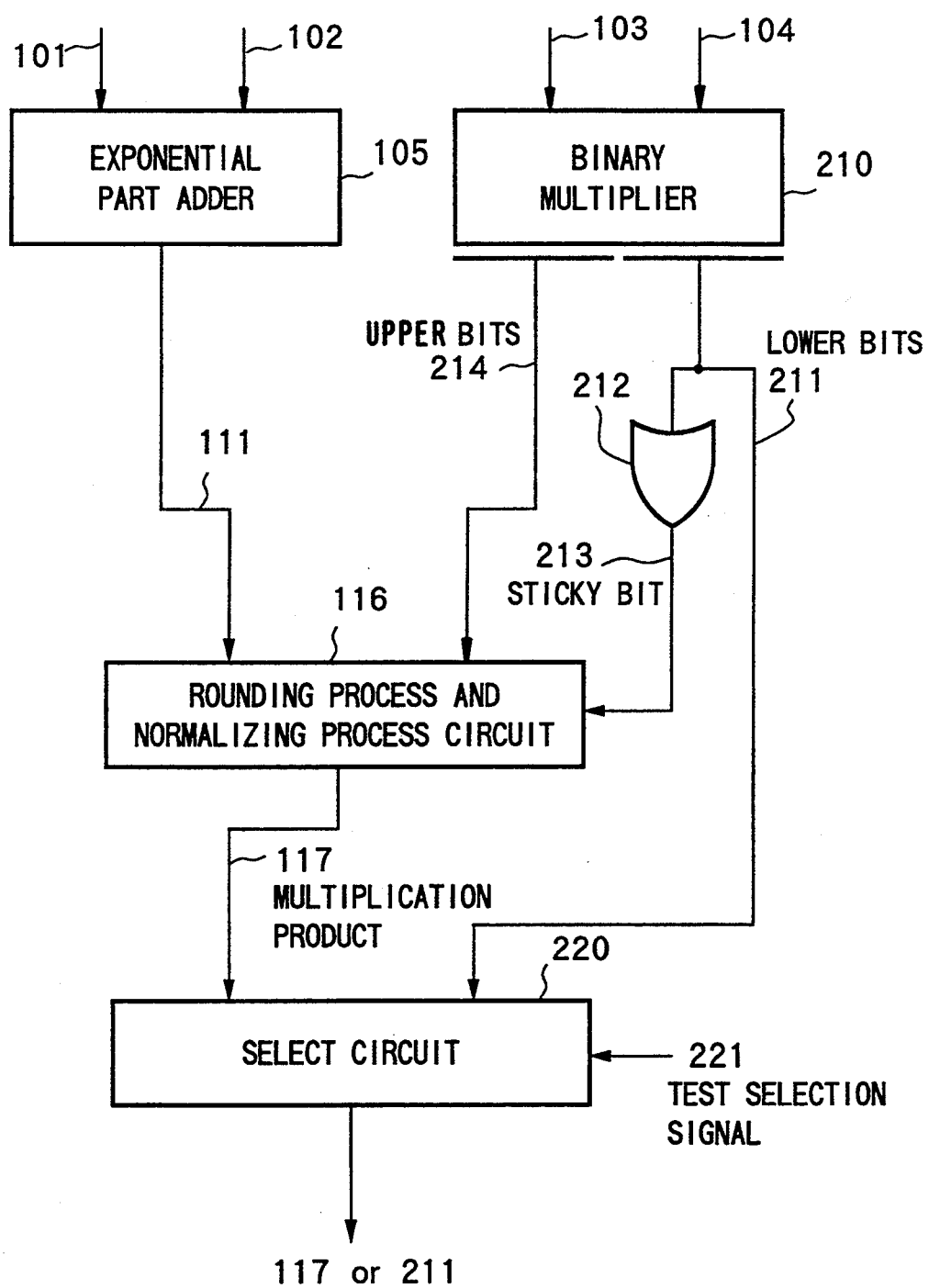
FIG. 1 is a block diagram showing a construction of the first embodiment of a floating point multiplier according to the present invention.

The preferred embodiments of the present invention will be discussed hereinafter with reference to the accompanying drawings. FIG. 1 shows the first embodiment of a floating point multiplier according to the present invention.

In FIG. 1, the first embodiment of the floating point multiplier comprises an exponential part adder 105 for adding exponential parts of a multiplied value and a multiplying value, a binary multiplier 210 for receiving and multiplying mantissa of the multiplied value and the multiplying value, a rounding process and normalizing process circuit 116 for performing rounding process and normalizing process 212 for the product of multiplication by the binary multiplier 210, an gate for deriving a logical sum (OR) of lower m bits of the product of multiplication by the binary multiplier 210, and a select circuit 220 for selectively outputting the product of the multiplication of the multiplied value and the multiplying value or data for testing.

In the exponential part adder 105, exponential parts 101 and 102 of the multiplied value and the multiplying value are inputted. These inputs are processed by addition and then outputted as an addition result 111.

In the binary multiplier 210, mantissa of the multiplied value and the multiplying value are converted from n bits to p bits (n>0, p≧n) indication separated through the preceding and are inputted as input data 103 and 104. The binary multiplier 210 performs the multiplying process for the input data 103 and 104 and outputs the product of multiplication of (2p−1) bits.

Among the (2p−1) bits of the product of multiplication output from the binary multiplier 210, the lower m bits (m≦n: m=2p−1−q) 211 which excludes the upper q bits (q>n) are inputted to the OR gate 212. In the OR gate 212, the OR signal of the lower m bits 211 is derived and output as one bit sticky bit 213.

The rounding process and normalizing process circuit 116 takes the sticky bit 213 outputted from the OR gate 212 as a control signal and outputs the multiplication product 117 from the addition result 111 of the exponential parts in the exponential part adder 105 and upper q bits 214 of the multiplication result of the binary multiplier 210.

The rounding process to be performed by the rounding process and normalizing process circuit 116 is a process for rounding up (adding "1") the digit lower than the significant digit greater than equal to 0.5 and rounding down the digit smaller than 0.5 (outputting upper q bits as is). In particular, judgement is made on the basis of the sticky bit 213 and the upper q bits of the multiplication result of the binary multiplier 210 to selectively output a rounded up value derived by adding "1" to the upper q bits of the multiplication result of the binary multiplier 210 or a rounded down value which is the upper q bits per se (by rounding down the digit lower than the significant digit).

The normalization process in the rounding process and normalizing process circuit 116 is a process for inputting the the rounded up value or rounded down value through the rounding process and for effecting left shifting so that the upper 2 bits becomes greater than or equal to 1 and smaller than 2.

On the other hand, in the rounding process and normalizing process circuit 116, coupling of the value of the normalized mantissa and the addition result of the exponential parts from the exponential part adder 105 is effected and outputted as the multiplication product 117.

The select circuit 222 comprises a multiplexer, for example. To this selection circuit 220, in accordance to the test selection signal, the product of multiplication 117 and the lower m bits of the multiplication result output from the binary multiplier 210 are selectively outputted. The select circuit 220 outputs the multiplication product 117 when the test selection signal 221 is not input (normal multiplication mode). Only when the test selection signal 221 is inputted, the select circuit 220 outputs the lower m bits of the multiplication result of the binary multiplier 210. Accordingly, by use of the test selection signal 221, the floating point multiplier can be switched between the multiplication mode and the test mode.

In the above embodiment of the floating point multiplier, in addition to the original floating point multiplication, it is provided with an instruction for providing the test selection signal 221 for selectively outputting the lower bits of the output of the binary multiplier 210. Therefore, by outputting the lower bits of the output of the binary multiplier, the lower bits of the binary multiplier can be externally monitored if necessary. Accordingly, it becomes possible to easily perform testing for detecting failure of the internal gate of the binary multiplier, which can otherwise cause substantial difficulty as caused in the prior art.

For example, conventionally, since the presence of faulty gate of the binary multiplier 210 need to be judged on the basis of the sticky bits of the lower bit of the binary multiplier 210, a large number of test patterns must be preliminarily provided. Also, since the sticky bit of the OR gate 212 is an internal signal instead of a signal externally outputted from the floating point multiplier, testing has been cumbersome in the prior art.

In contrast to this, since the above embodiment permits selective output of the lower bits of the binary multiplier externally, it becomes possible to monitor the overall output of the binary multiplier 210. As a result, the number of test pattern required for testing can be significantly reduced so as to significantly reduce the work load and working time. It should be appreciated that, concerning the gates corresponding to the upper bits of the binary multiplier, since the upper bits are externally output as the final result of multiplication, the test can be performed by simply monitoring the output. Therefore, the inconvenience as experienced in the lower bits will never arise.

FIG. 2 shows the second embodiment of a floating point multiplier according to the present invention. The shown floating point multiplier has a construction, in which the rounding process in the first embodiment is deleted. In place of the rounding process and normalizing process circuit 116, a normalizing process circuit 300 which performs normalization only for the upper bits of the binary multiplier 210 is included. Further, the OR gate for deriving the sticky bit is not provided. To the normalization circuit 300. The upper bits of the normalized output of the binary multiplier 210 and the exponential part adding result of the exponential part adder 105 are combined to output the final product of the multiplication to a selection circuit 320 which may, for instance, comprise a multiplexer.

In a conventional application of this kind of floating point multiplier, the lower bits of the output of the binary multiplier is normally truncated or rounded down so as not to be outputted externally. Therefore, in order to monitor the lower bits of the output of the multiplier 210, it is necessary to monitor the lower bits of the output of the binary multiplier incorporated in the floating point multiplier. This makes testing labor and time intensive work.

In the second embodiment, since the lower bit of the multiplication result of the binary multiplier can be externally outputted as the output of the floating point multiplier 210, it becomes possible to monitor the lower bit of the binary multiplier. Thus, it becomes possible to easily perform a test for detection of a faulty gate of the binary multiplier 210.

Although the invention has been illustrated and described with respect to the exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the feature set out in the appended claims.

What is claimed is:

1. A floating point multiplier comprising:

exponential part adder means for receiving and adding exponential parts of a multiplied value and a multiplying value and outputting an addition result of the exponential parts;

binary multiplier means for receiving and multiplying mantissa of the multiplied value and the multiplying value and outputting a multiplication result of the mantissa;

an OR gate which receives a predetermined number of lower order bits of the multiplication result and outputs a logical sum of the lower order bits as a sticky bit;

rounding process and normalization process means for receiving a predetermined number of higher order bits of said multiplication result and said sticky bit, performing a rounding process and a normalizing process for the higher order bits of the multiplication result on the basis of the sticky bit, coupling a result of normalization with the addition result of the exponential parts and outputting a final multiplication result; and selection means for receiving the final multiplication result and the lower order bits of the multiplication result of the binary multiplier means and selectively outputting said lower order bits.

2. A floating point multiplier as set forth in claim 1, wherein said selection means receives an externally provided selection signal for outputting the final multiplication result when said selection signal is absent and for outputting the lower order bits of the multiplication result of the binary multiplier means only when said selection signal is present.

3. A floating point multiplier as set forth in claim 1, wherein said selection means comprises a multiplexer.

4. A floating point multiplier as set forth in claim 1, wherein said binary multiplier means allocates p bits to receive mantissa of n bits (n>o; p≧n) and outputs the multiplication result of (2p−1) bits;

said OR gate receives the lower (2p−1−q) bits (q>n) for deriving and outputting a logical sum as said sticky bit;

said rounding process and normalizing process means receives the upper q bits of the multiplication result, the addition result and the sticky bit; and said selection means receives the final multiplication result and the lower (2p−1−q) bits of the multiplication result of the binary multiplier means.

5. A floating point multiplier comprising:

exponential part adder means for receiving and adding exponential parts of a multiplied value and a multiplying value and outputting an addition result of the exponential parts;

binary multiplier means for receiving and multiplying mantissa of the multiplied value and the multiplying value and outputting a multiplication result of the mantissa;

normalization process means for receiving a predetermined number of higher order bits of said multiplication result and said addition result, performing a normalizing process for the higher order bits of the multiplication result coupling a result of normalization with the addition result of the exponential parts and outputting a final multiplication result; and selection means for receiving the final multiplication result and a predetermined number of lower order bits of the multiplication result of the binary multiplier means and selectively outputting said lower order bits.

6. A floating point multiplier as set forth in claim 5, wherein said selection means receives an externally provided selection signal for outputting the final multiplication result when said selection signal is absent and for outputting the lower order bits of the multiplication result of the binary multiplier means only when said selection signal is present.

7. A floating point multiplier as set forth in claim 5, wherein said selection means comprises a multiplexer.

8. A floating point multiplier as set forth in claim 5, wherein said binary multiplier means allocates p bits to receive mantissa of n bits (n>o; p≧n) and outputs the multiplication result of (2p−1) bits; and said selection means receives the final multiplication result and the lower (2p−1−q) bits of the multiplication result of the binary multiplier means.

* * * * *